US012684785B2

(12) United States Patent
Noh et al.

(10) Patent No.: US 12,684,785 B2
(45) Date of Patent: Jul. 14, 2026

(54) SEMICONDUCTOR MEMORY DEVICE

(71) Applicant: SAMSUNG ELECTRONICS CO., LTD., Suwon-si (KR)

(72) Inventors: Youngji Noh, Suwon-si (KR); Jongho Woo, Suwon-si (KR); Joo-Heon Kang, Suwon-si (KR); Kyunghoon Kim, Suwon-si (KR); Myunghun Woo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 292 days.

(21) Appl. No.: 18/215,280

(22) Filed: Jun. 28, 2023

(65) Prior Publication Data

US 2024/0164116 A1 May 16, 2024

(30) Foreign Application Priority Data

Nov. 16, 2022 (KR) ........................ 10-2022-0153896

(51) Int. Cl.
H10B 63/00 (2023.01)
(52) U.S. Cl.
CPC ........... H10B 63/845 (2023.02); H10B 63/34 (2023.02)
(58) Field of Classification Search
CPC ...... H10B 63/845; H10B 63/34; H10B 63/10;
H10B 63/30; H10B 63/84; H10N 70/20;
H10N 70/231; H10N 70/823; H10N
70/8828; H10N 70/8833; H10N 70/8836;
H10N 70/826
See application file for complete search history.

(56) References Cited

U.S. PATENT DOCUMENTS

| | | | |
|---|---|---|---|
| 8,247,788 B2 | 8/2012 | Seol et al. | |
| 9,236,417 B2 | 1/2016 | Park | |
| 9,484,389 B2 | 11/2016 | Wouters et al. | |
| 9,859,338 B2 | 1/2018 | Chen et al. | |
| 11,309,354 B2 | 4/2022 | Han et al. | |
| 12,207,480 B2 * | 1/2025 | Chiba | H10N 70/8825 |
| 2021/0210551 A1 | 7/2021 | Han | |
| 2021/0375919 A1 | 12/2021 | Wang et al. | |
| 2021/0408045 A1 | 12/2021 | Chiang et al. | |
| 2022/0399400 A1 * | 12/2022 | Takashima | H10B 63/10 |

FOREIGN PATENT DOCUMENTS

KR     20210083125 A     7/2021

* cited by examiner

*Primary Examiner* — Allison Bernstein
(74) *Attorney, Agent, or Firm* — Muir Patent Law, PLLC

(57) ABSTRACT

A semiconductor device includes a gate stacked structure including gate patterns and insulating patterns that are alternately stacked with each other; a gate insulating layer on a sidewall of the gate stacked structure; a channel layer surrounded by the gate insulating layer; a source line surrounded by the channel layer; a variable resistive layer surrounded by the channel layer; and a drain line surrounded by the channel layer.

19 Claims, 25 Drawing Sheets

FIG. 2A

SEMICONDUCTOR MEMORY DEVICE

CROSS-REFERENCE TO RELATED APPLICATIONS

This U.S. non-provisional patent application claims priority under 35 U.S.C.§ 119 to Korean Patent Application No. 10-2022-0153896, filed on Nov. 16, 2022, in the Korean Intellectual Property Office, the entire contents of which are hereby incorporated by reference.

BACKGROUND

1. Field

Embodiments relate to a semiconductor memory device.

2. Description of the Related Art

Semiconductor devices are widely used in the electronics industry because of small size, multi-function, and/or low manufacture costs thereof. The semiconductor devices may be categorized into semiconductor memory devices storing logic data, semiconductor logic devices processing operations of logical data, and hybrid semiconductor devices having both the function of the semiconductor memory devices and the function of the semiconductor logic devices.

Recently, with high speed and low power consumption of the electronic devices, demand for high speed and/or low operating voltage and a more highly integrated semiconductor device may be used satisfy such demand.

SUMMARY

The embodiments may be realized by providing a semiconductor device including a gate stacked structure including gate patterns and insulating patterns that are alternately stacked with each other; a gate insulating layer on a sidewall of the gate stacked structure; a channel layer surrounded by the gate insulating layer; a source line surrounded by the channel layer; a variable resistive layer surrounded by the channel layer; and a drain line surrounded by the channel layer.

The embodiments may be realized by providing a semiconductor device including gate stacked structures spaced apart from each other, each of the gate stacked structures including gate patterns and insulating patterns that are alternately stacked with each other; a gate insulating layer between the gate stacked structures; a channel layer in the gate insulating layer; a source line in the channel layer; a variable resistive layer in the channel layer; and a drain line in the channel layer, wherein the drain line and an upper portion of the channel layer are spaced apart from each other.

The embodiments may be realized by providing a semiconductor device including gate stacked structures spaced apart from each other, each of the gate stacked structures including gate patterns and insulating patterns that are alternately stacked with each other; separation insulating layers between the stacked structures; a gate insulating layer between the separation insulating layers; a channel layer surrounded by the gate insulating layer; a source line surrounded by the channel layer; a variable resistive layer surrounded by the channel layer; a drain line surrounded by the channel layer; and a capping layer between the source line and the drain line, wherein the variable resistive layer includes an inner sidewall in contact with the drain line and the capping layer and an outer sidewall in contact with the channel layer.

The embodiments may be realized by providing a method of manufacturing a semiconductor device, the method including forming a gate stacked structure including gate patterns and insulating patterns that are alternately stacked with each other; forming a gate insulating layer on a sidewall of the gate stacked structure; forming a channel layer in the gate insulating layer; forming a preliminary variable resistive layer in the channel layer; forming a drain line and a sacrificial line in the preliminary variable resistive layer; forming a cavity by removing portions of the sacrificial line and the preliminary variable resistive layer; and forming a source line in the cavity.

BRIEF DESCRIPTION OF THE DRAWINGS

Features will become apparent to those of skill in the art by describing in detail exemplary embodiments with reference to the attached drawings in which:

FIG. 2A is a perspective view of a semiconductor device according to some embodiments.

DETAILED DESCRIPTION

Hereinafter, a semiconductor device and a manufacturing method thereof according to embodiments will be described in detail with reference to the accompanying drawings.

Figure 1:
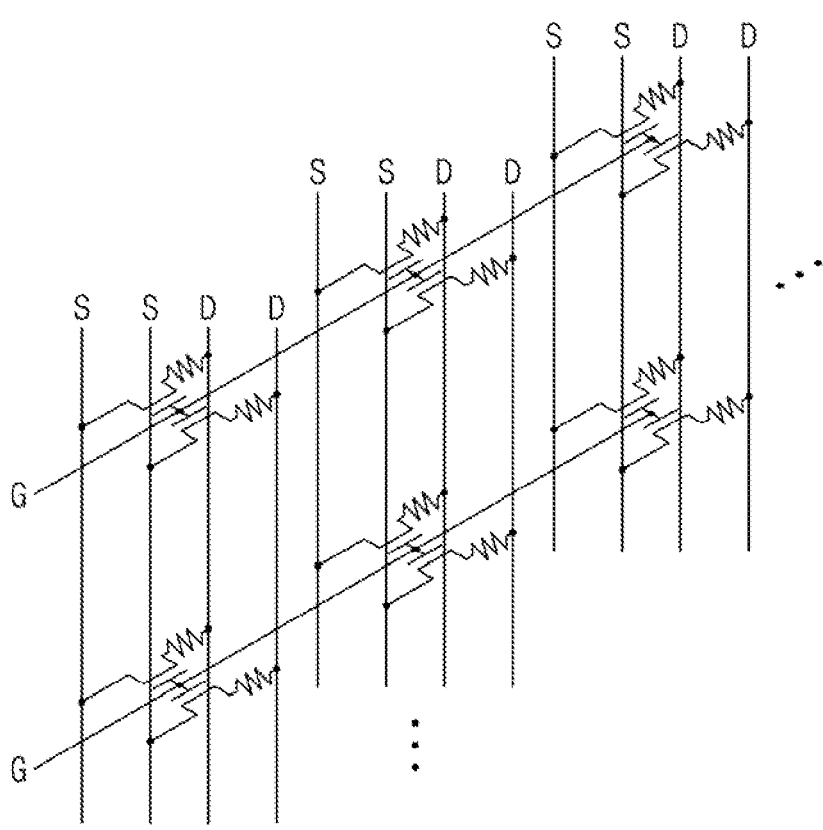
FIG. 1 is a circuit diagram of a cell region of a semiconductor device according to some embodiments.

FIG. 1 is a circuit diagram of a cell region of a semiconductor device according to some embodiments.

Referring to FIG. 1, a cell region of a semiconductor device may include source lines S, drain lines D, and gate lines G. A source line S, a drain line D, and a gate line G may constitute a cell transistor. A plurality of source lines S may be connected to one gate line G. A plurality of drain lines D may be connected to one gate line G. A plurality of gate lines G may be connected to one source line S. A plurality of gate lines G may be connected to one drain line D.

The gate line G may cross the source line S and the drain line D. A variable resistor may be between the drain line D and the gate line G. The semiconductor device may be a variable resistive memory device.

Figure 2A:
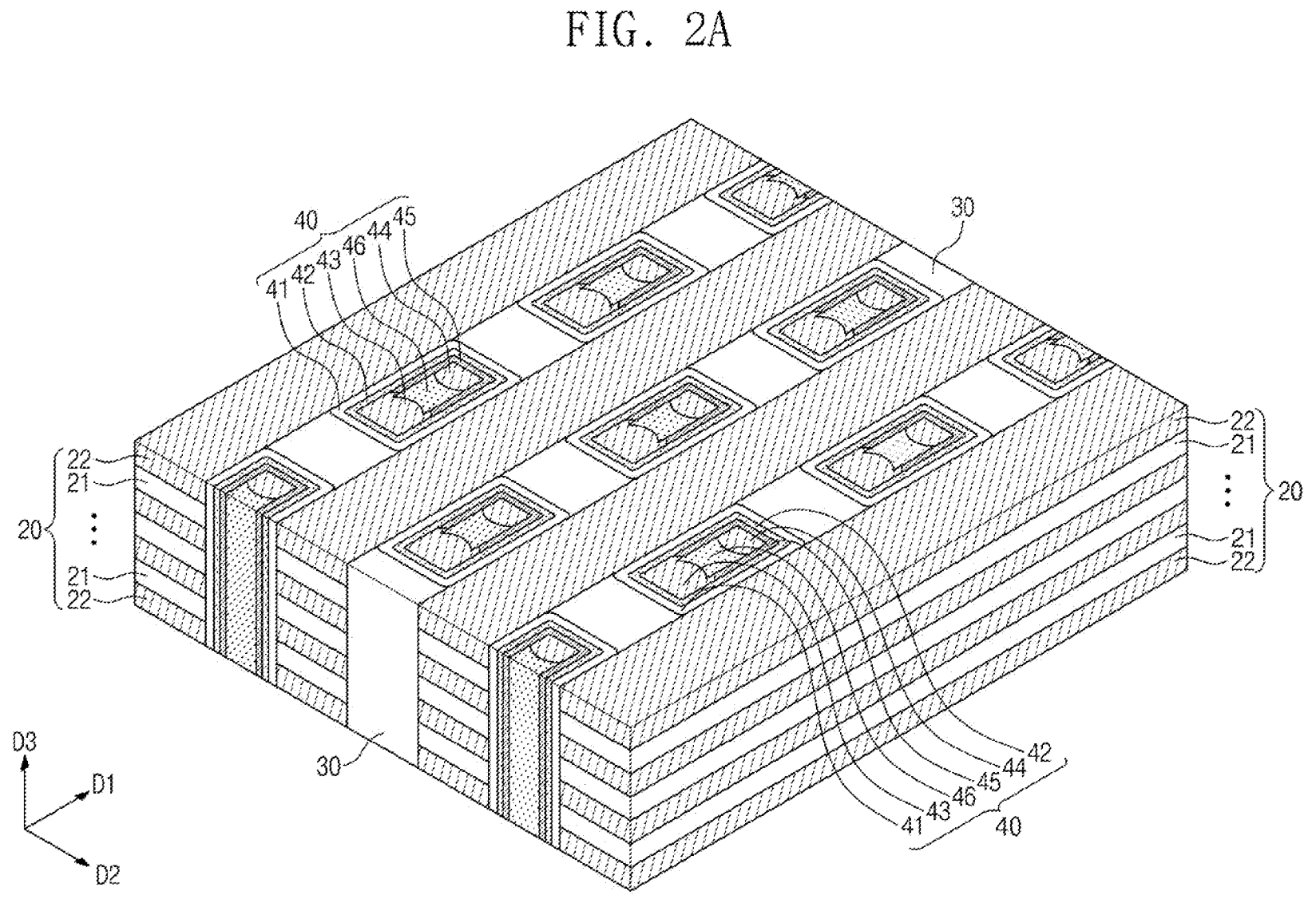
Figure 2B:
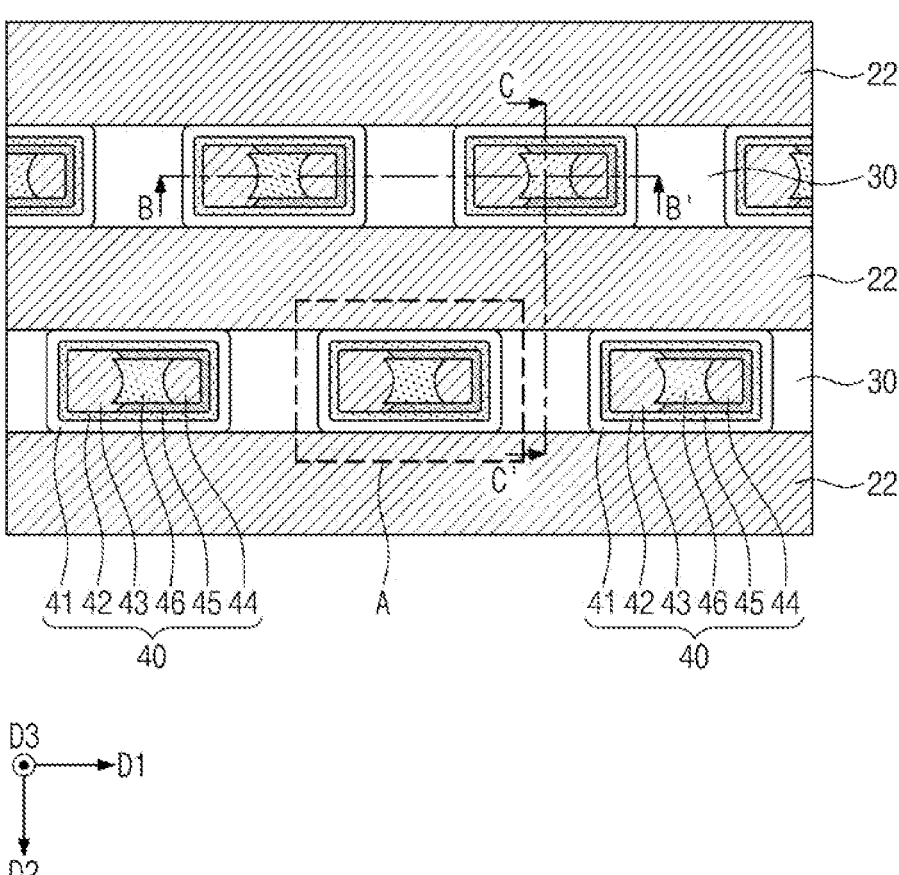
FIG. 2B is a plan view of a semiconductor device according to some embodiments.
Figure 2C:
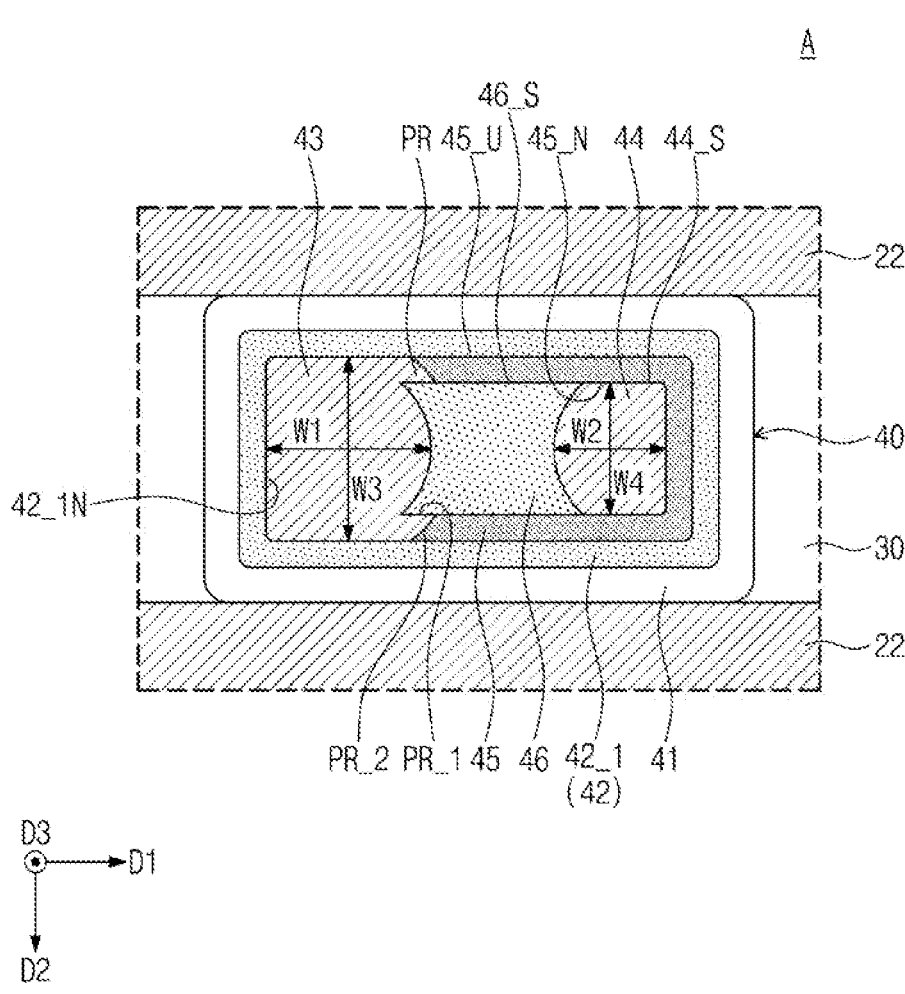
FIG. 2C is an enlarged view of region 'A' of FIG. 2B.
Figure 2D:
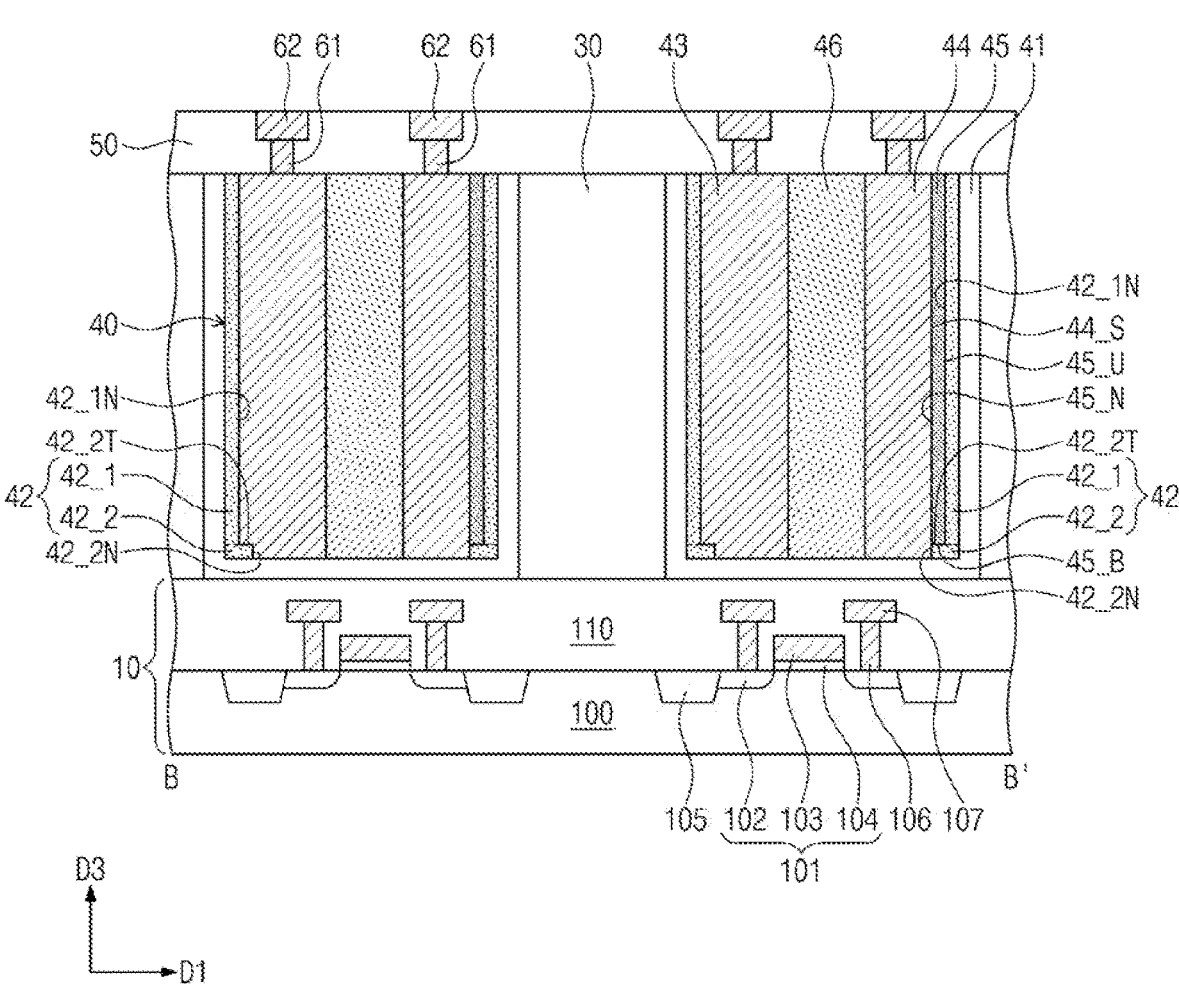
FIG. 2D is a cross-sectional view taken along line B-B' of FIG. 2B.
Figure 2E:
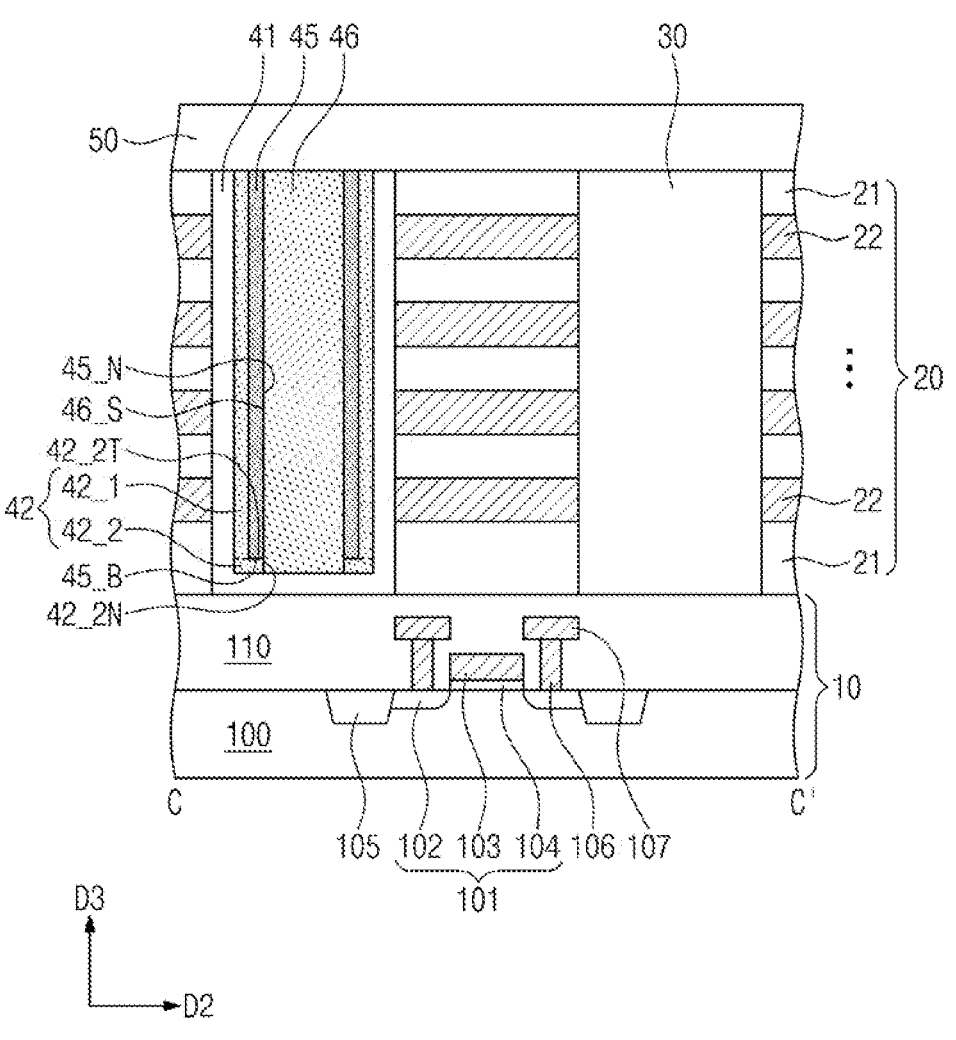
FIG. 2E is a cross-sectional view taken along line C-C' of FIG. 2B.

FIG. 2A is a perspective view of a semiconductor device according to some embodiments. FIG. 2B is a plan view of a semiconductor device according to some embodiments. FIG. 2C is an enlarged view of region 'A' of FIG. 2B. FIG. 2D is a cross-sectional view taken along line B-B' of FIG. 2B. FIG. 2E is a cross-sectional view taken along line C-C' of FIG. 2B.

Referring to FIGS. 2A, 2B, 2C, 2D and 2E, a semiconductor device may include a peripheral circuit structure 10. The peripheral circuit structure 10 may include a substrate 100, a peripheral transistor 101, a device isolation layer 105, peripheral contacts 106, peripheral conductive lines 107, and a peripheral insulating layer 110.

The substrate 100 may have a plate shape extending along a plane defined by a first direction D1 and a second direction D2. The first direction D1 and the second direction D2 may cross each other. In an implementation, the first direction D1 and the second direction D2 may be horizontal directions orthogonal to each other. In an implementation, the substrate 100 may be a semiconductor substrate. In an implementation, the substrate 100 may include silicon, germanium, silicon-germanium, GaP, or GaAs. In an implementation, the substrate 100 may be a silicon-on-insulator (SOI) substrate or a germanium-on-insulator (GOI) substrate. As used herein, the term "or" is not an exclusive term, e.g., "A or B" would include A, B, or A and B.

The peripheral insulating layer 110 may be on the substrate 100. The peripheral insulating layer 110 may include an insulating material. In an implementation, the peripheral insulating layer 110 may include an oxide. In an implementation, the peripheral insulating layer 110 may be a multi-insulating layer.

The peripheral transistor 101 may be between the substrate 100 and the peripheral insulating layer 110. In an implementation, the peripheral transistor 101 may include source/drain regions 102, a gate electrode 103, and a gate insulating layer 104. The device isolation layers 105 may be in the substrate 100. The peripheral transistor 101 may be between the device isolation layers 105. The device isolation layer 105 may include an insulating material.

The peripheral contact 106 may be connected to the peripheral transistor 101, and the peripheral conductive line 107 may be connected to the peripheral contact 106. The peripheral contact 106 and the peripheral conductive line 107 may be in the peripheral insulating layer 110. The peripheral contact 106 and the peripheral conductive line 107 may include a conductive material.

Gate stacked structures 20 may be on the peripheral circuit structure 10. Each of the gate stacked structures 20 may include insulating patterns 21 and gate patterns 22 alternately stacked with each other in a third direction D3. The third direction D3 may cross the first direction D1 and the second direction D2. In an implementation, the third direction D3 may be a vertical direction orthogonal to the first and second directions D1 and D2.

The gate stacked structures 20 may extend (e.g., lengthwise) in the first direction D1. The gate stacked structures 20 may be spaced apart from each other in the second direction D2. The gate stacked structures 20 may be (e.g., repeatedly) arranged in the second direction D2.

The insulating patterns 21 may extend in the first direction D1. The insulating patterns 21 at a same level (e.g., a same distance in the third direction D3 from the substrate 100) may be arranged in the second direction D2. The insulating patterns 21 may include an insulating material. In an implementation, the insulating patterns 21 may include an oxide.

The gate patterns 22 may extend in the first direction D1. The gate patterns 22 at the same level may be arranged in the second direction D2. The gate patterns 22 may include a conductive material. In an implementation, the gate patterns 22 may include tungsten.

Separation insulating layers 30 may be on the peripheral circuit structure 10. The separation insulating layers 30 may be between the gate stacked structures 20. A plurality of separation insulating layers 30 may be between two adjacent gate stacked structures 20. The separation insulating layers 30 may be on sidewalls of the gate stacked structure 20. The separation insulating layer 30 may be in contact (e.g., direct contact) with the gate patterns 22 and the insulating patterns 21 stacked in the third direction D3. The separation insulating layer 30 may include an insulating material. In an implementation, the separation insulating layer 30 may include an oxide.

A channel structure 40 may be between the separation insulating layers 30. The channel structure 40 may be between two separation insulating layers 30 adjacent to each other. The channel structure 40 may be between two gate stacked structures 20 adjacent to each other. The channel structure 40 may be on a sidewall of the separation insulating layer 30. The channel structure 40 may be on sidewalls of the gate stacked structure 20. The channel structure 40 may be in contact with the gate patterns 22 and the insulating patterns 21 stacked in the third direction D3. The channel structure 40 may be on the peripheral circuit structure 10. The channel structures 40 and the separation insulating layers 30 may be alternately arranged in or along the first direction D1.

The channel structure 40 may include a gate insulating layer 41, a channel layer 42, a source line 43, a drain line 44, a variable resistive layer 45, and a capping layer 46. The gate insulating layer 41, the channel layer 42, the source line 43, the drain line 44, the variable resistive layer 45, and the capping layer 46 may be between two adjacent gate stacked structures 20. The gate insulating layer 41, the channel layer 42, the source line 43, the drain line 44, the variable resistive layer 45, and the capping layer 46 may be between two separation insulating layers 30 adjacent to each other.

The channel layer 42 may surround the source line 43, the drain line 44, the variable resistive layer 45, and the capping layer 46. The source line 43, the drain line 44, the variable resistive layer 45, and the capping layer 46 may be in, e.g., laterally contained within or surrounded on lateral sides by, the channel layer 42. The gate insulating layer 41 may surround the channel layer 42. The channel layer 42 may be in the gate insulating layer 41. The gate insulating layer 41 may be on the peripheral circuit structure 10. The channel layer 42, the source line 43, the drain line 44, the variable resistive layer 45, and the capping layer 46 may be on (e.g., contained within a shape or structure formed by) the gate insulating layer 41.

The gate insulating layer 41 may be on sidewalls of the gate stacked structure 20. The gate insulating layer 41 may be in contact with the gate patterns 22 and the insulating patterns 21 stacked in the third direction D3. The gate insulating layer 41 may be in contact with the peripheral insulating layer 110 of the peripheral circuit structure 10. The gate insulating layer 41 may include an insulating material. In an implementation, the gate insulating layer 41 may include, e.g., an oxide.

The channel layer 42 may include a semiconductor material, an oxide semiconductor material, or a two-dimensional material. The semiconductor material may include, e.g., polysilicon, Si, SiGe, or a selective epitaxial growth (SEG) semiconductor material. The oxide semiconductor material may include, e.g., IGZO, Sn-IGZO, IWO, IZO, ZTO, or YZO. The two-dimensional material may include, e.g., $MoS_2$, $MoSe_2$ or $WS_2$.

The channel layer 42 may include an upper portion 42_1 and a lower portion 42_2. An inner sidewall 42_1N of the upper portion 42_1 of the channel layer 42 may be in contact with an outer sidewall 45_U of the variable resistive layer 45. An inner sidewall 42_2N of the lower portion 42_2 of the channel layer 42 may be in contact with a sidewall 44_S of the drain line 44. The inner sidewall 42_1N of the upper portion 42_1 of the channel layer 42 may be spaced apart from the sidewall 44_S of the drain line 44. The variable resistive layer 45 may be between the inner sidewall 42_1N of the upper portion 42_1 of the channel layer 42 and the sidewall 44_S of the drain line 44. An upper surface 42_2T of the lower portion 42_2 of the channel layer 42 may be in contact with a lower surface 45_B of the variable resistive layer 45. The upper surface 42_2T of the lower portion 42_2 of the channel layer 42 may connect the inner sidewall 42_2N of the lower portion 42_2 of the channel layer 42 and the inner sidewall 42_1N of the upper portion 42_1 of the channel layer 42.

The variable resistive layer 45 may be on the lower portion 42_2 of the channel layer 42. The inner sidewall 42_1N of the upper portion 42_1 of the channel layer 42 may be in contact with the source line 43. The upper surface 42_2T and the inner sidewall 42_2N of the lower portion 42_2 of the channel layer 42 may be in contact with the source line 43.

The variable resistive layer 45 may include a metal oxide (e.g., a transition metal oxide), a perovskite oxide, or a chalcogenide oxide. The metal oxide may include, e.g., $HfO_2$, $TaO_2$, $ZrO_2$, $AlO_2$, $NbO_x$, $NiO$, $TiO_2$, or $WO_3$. The perovskite oxide may include, e.g., $Pr_xMnO_3$, $La_xMnO_3$, and $Gd_xMnO_3$. The chalcogenide oxide may include, e.g., GST. In an implementation, the variable resistive layer 45 may include a plurality of layers including different materials.

An inner sidewall 45_N of the variable resistive layer 45 may be in contact with the sidewall 44_S of the drain line 44. The inner sidewall 45_N of the variable resistive layer 45 may be in contact with a sidewall 46_S of the capping layer 46.

The source line 43 and the drain line 44 may include a conductive material. In an implementation, the source line 43 and the drain line 44 may include tungsten. A width of the source line 43 may be greater than that of the drain line 44. A width W1 of the source line 43 in the first direction D1 may be greater than a width W2 of the drain line 44 in the first direction D1. A width W3 of the source line 43 in the second direction D2 may be greater than a width W4 of the drain line 44 in the second direction D2. The drain line 44 may be within (e.g., surrounded on three sides by) the variable resistive layer 45.

The source line 43 may include protrusions PR in contact with the variable resistive layer 45 and the capping layer 46. The protrusion PR may be between the channel layer 42 and the capping layer 46. Each of the protrusions PR may include a first surface PR_1 in contact with the capping layer 46 and a second surface PR_2 in contact with the variable resistive layer 45. The first surface PR_1 of the protrusion PR may be flat. The second surface PR_2 of the protrusion PR may be curved or rounded. A width of the protrusion PR in the second direction D2 may be the same as a width of the variable resistive layer 45 in the second direction D2. A portion of the capping layer 46 may be between the protrusions PR.

The capping layer 46 may include an insulating material. In an implementation, the capping layer 46 may include silicon nitride. The capping layer 46 may be between the source line 43 and the drain line 44. A portion of the capping layer 46 may be within (e.g., surrounded on three sides by) the variable resistive layer 45.

A cover insulating layer 50 may be on the gate stacked structures 20, the separation insulating layers 30, and the channel structures 40. The cover insulating layer 50 may include an insulating material. In an implementation, the cover insulating layer 50 may include an oxide. In an implementation, the cover insulating layer 50 may be a multi-insulating layer.

Connection contacts 61 and connection conductive lines 62 may be in the cover insulating layer 50. The connection contact 61 may be connected to the source line 43 or the drain line 44. The connection conductive line 62 may be connected to the connection contact 61. The connection contact 61 and the connection conductive line 62 may include a conductive material.

In a semiconductor device according to some embodiments, a source line 43 and a drain line 44 may be in one channel hole. Accordingly, integration of the semiconductor device may be improved.

In a semiconductor device according to some embodiments, the insulating patterns 21 and the gate patterns 22 may be vertically stacked, and the integration of the semiconductor device may be improved.

A semiconductor device according to some embodiments may implement a 1T-1R structure by disposing the variable resistive layer 45 adjacent to the drain line 44.

FIGS. 3A, 3B, 3C, 4A, 4B, 4C, 5A, 5B, 5C, 6A, 6B, 6C, 7A, 7B, 7C, 8A, 8B, 9A, and 9B are cross-sectional views of stages in a method of manufacturing a semiconductor device according to some embodiments. FIGS. 3A, 4A, 5A, 6A, and 7A may correspond to FIG. 2B. FIGS. 3B, 4B, 5B, 6B, 7B, 8B, and 9B may correspond to FIG. 2D. FIGS. 3C, 4C, 5C, 6C, and 7C may correspond to FIG. 2E. FIGS. 8A and 9A may correspond to FIG. 2C.

Figure 3A:
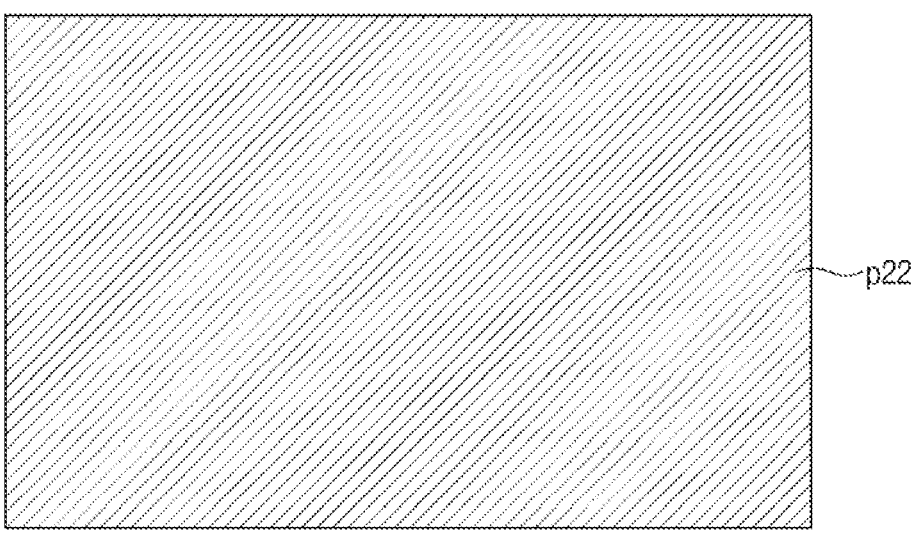
FIGS. 3A, 3B, 3C, 4A, 4B, 4C, 5A, 5B, 5C, 6A, 6B, 6C, 7A, 7B, 7C, 8A, 8B, 9A, and 9B are cross-sectional views of stages in a method of manufacturing a semiconductor device according to some embodiments.
Figure 3A:
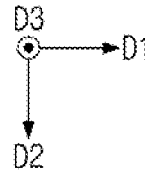
Figure 3B:
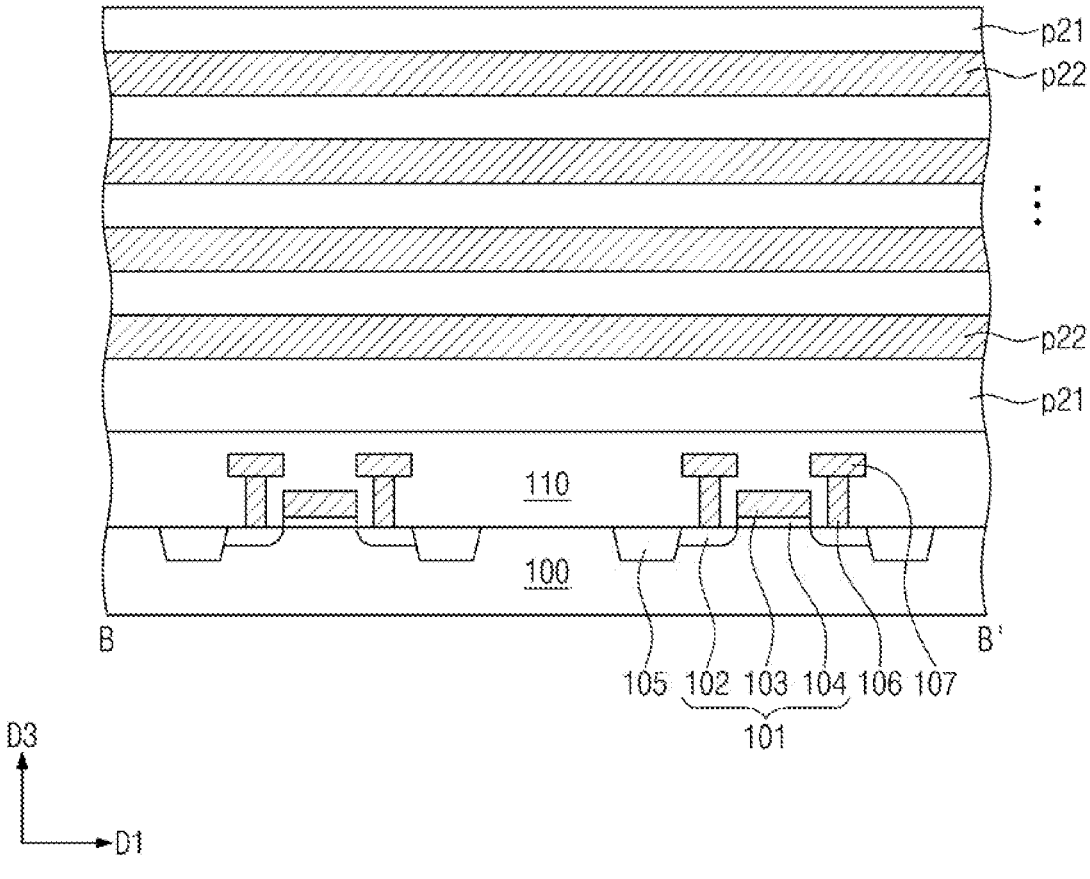
Figure 3C:
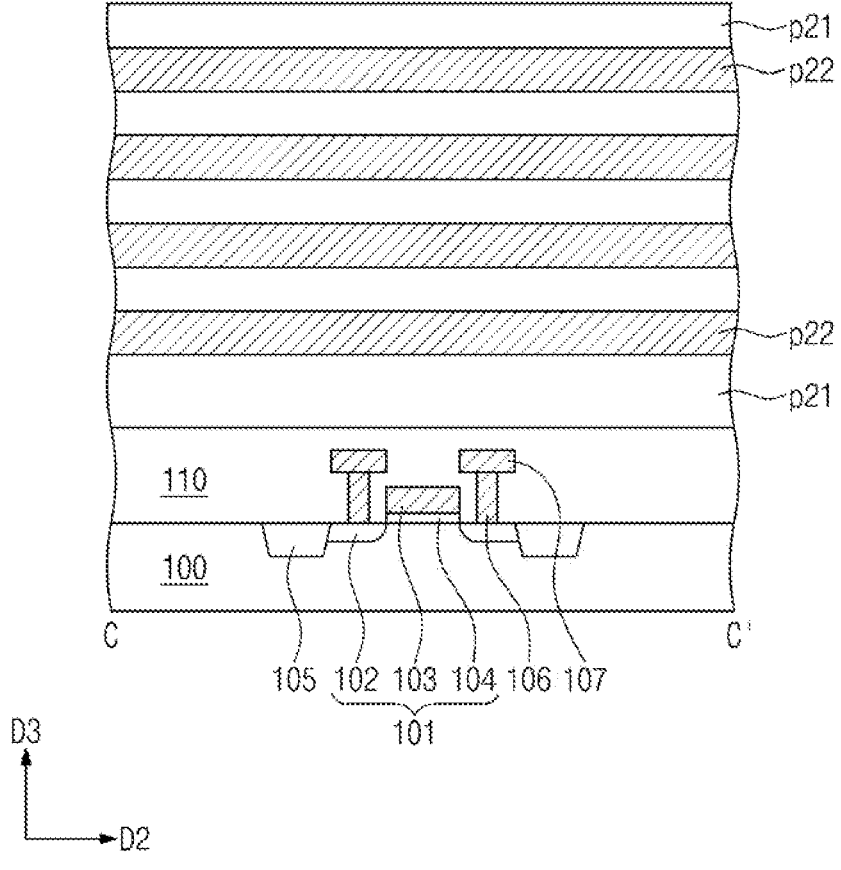

Referring to FIGS. 3A, 3B, and 3C, a peripheral transistor 101, a device isolation layer 105, peripheral contacts 106, peripheral conductive lines 107, and a peripheral insulating layer 110 may be formed on a substrate 100. The peripheral transistor 101 may include source/drain regions 102, a gate electrode 103 and a gate insulating layer 104.

On the peripheral insulating layer 110, preliminary gate pattern layers p22 and preliminary insulating pattern layers p21 may be alternately stacked in a third direction D3. The preliminary gate pattern layers p22 may include a conductive material. In an implementation, the preliminary gate pattern layers p22 may include tungsten. The preliminary insulating pattern layers p21 may include an insulating material. In an implementation, the preliminary insulating pattern layers p21 may include an oxide.

Figure 4A:
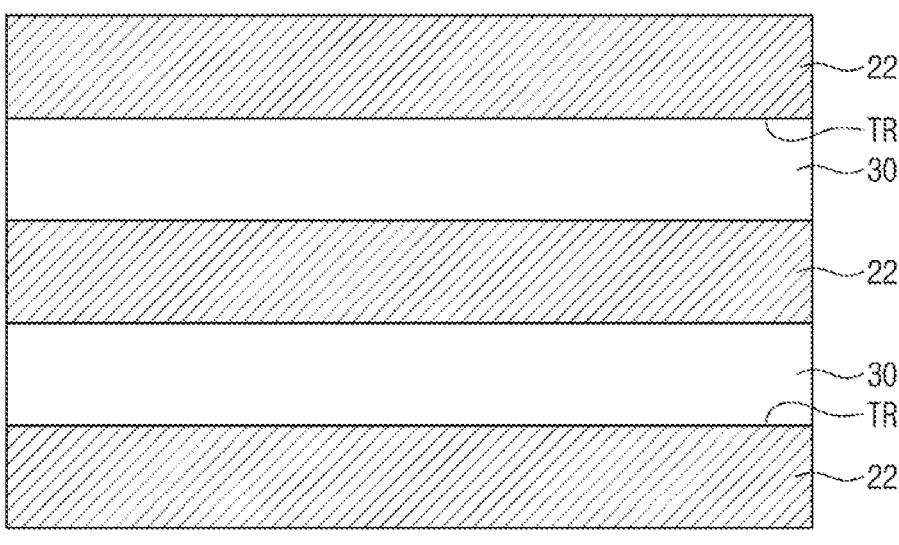
Figure 4B:
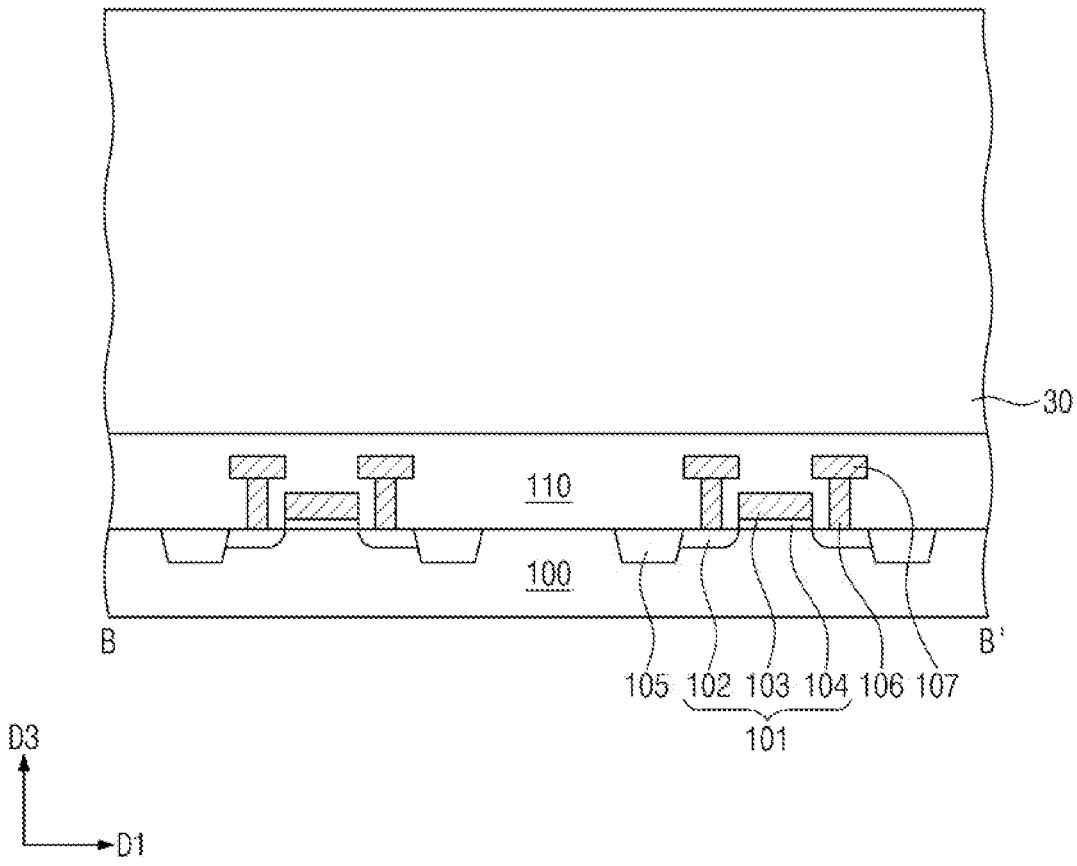
Figure 4C:
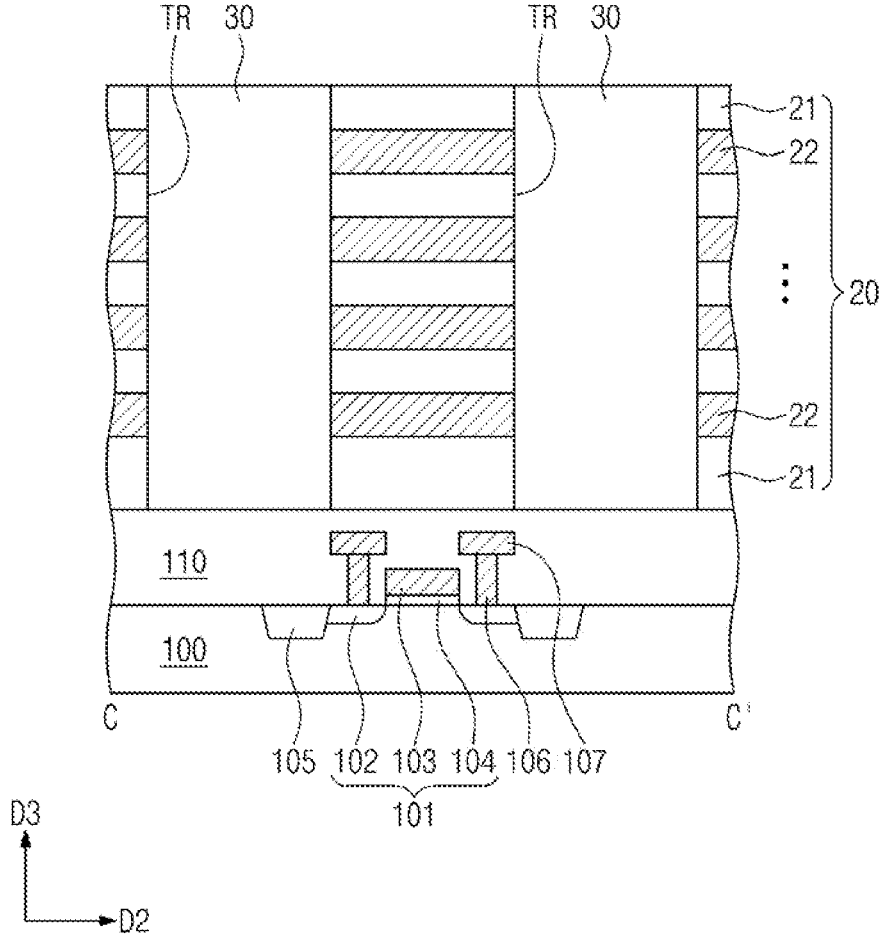

Referring to FIGS. 4A, 4B and 4C, separation insulating layers 30 may be formed. Forming the separation insulating layers 30 may include forming trenches TR penetrating the preliminary gate pattern layers p22 and the preliminary insulating pattern layers p21, and forming the separation insulating layers 30 in the trenches TR.

The trench TR may extend in a first direction D1. The preliminary gate pattern layers p22 penetrated by the trenches TR may be defined as gate patterns 22. One preliminary gate pattern layer p22 may be separated into a plurality of gate patterns 22. The preliminary insulating pattern layers p21 penetrated by the trenches TR may be defined as the insulating patterns 21. One preliminary insulating pattern layer p21 may be separated into a plurality of insulating patterns 21. The gate patterns 22 and the insulating patterns 21 may be formed to define a gate stacked structure 20 including the gate patterns 22 and the insulating patterns 21 stacked in the third direction D3. The gate stacked structures 20 and the separation insulating layers 30 may be alternately arranged in a second direction D2.

Figure 5A:
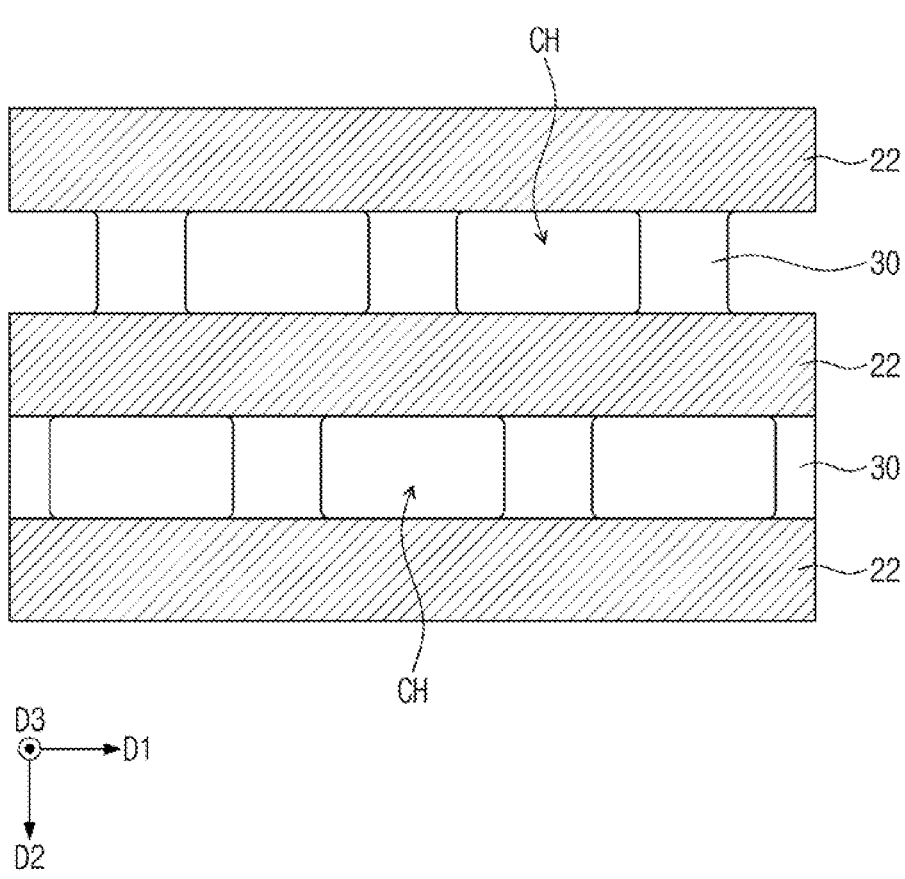
Figure 5B:
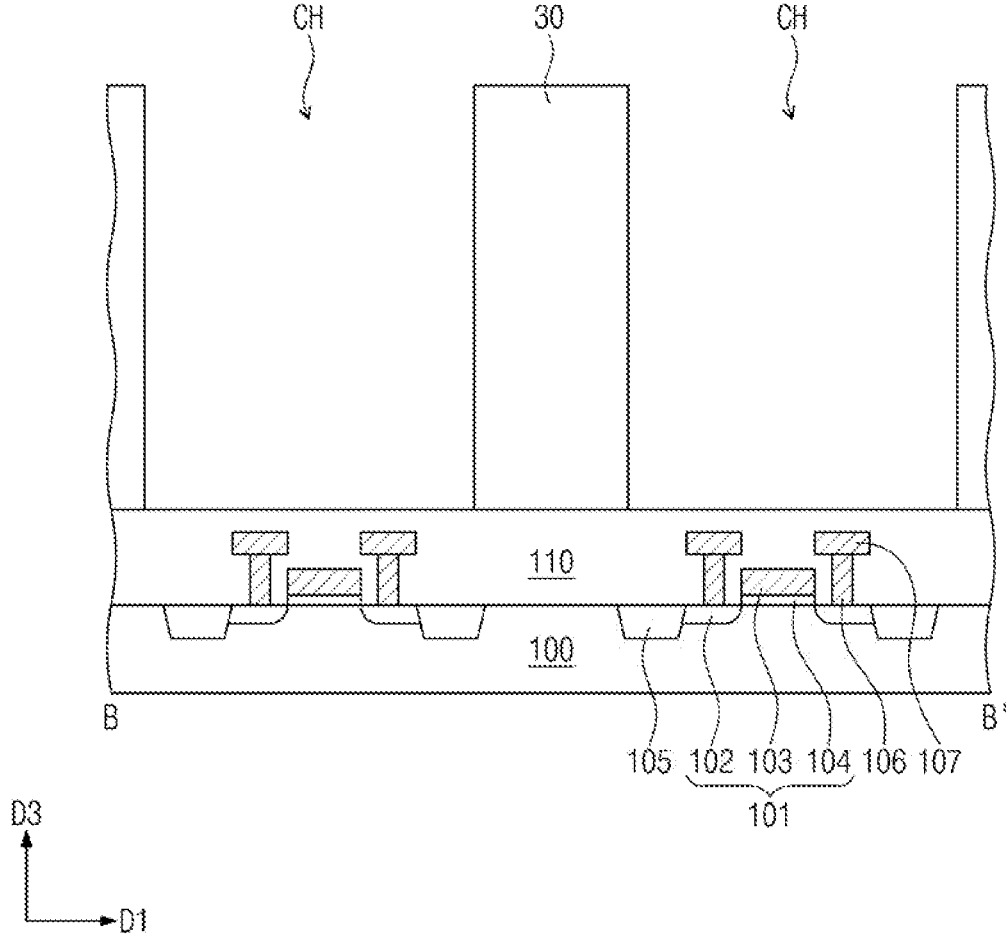
Figure 5C:
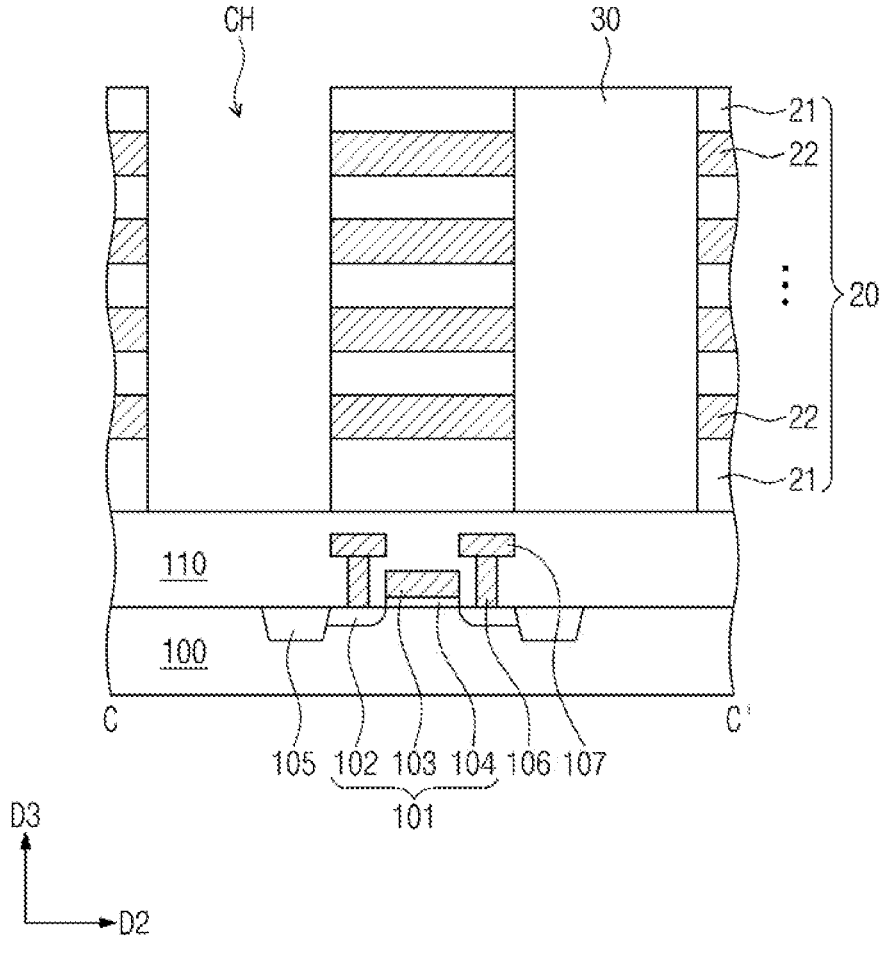

Referring to FIGS. 5A, 5B, and 5C, channel holes CH may be formed. A plurality of channel holes CH may pass through one separation insulating layer 30. The plurality of channel holes CH passing through one separation insulating layer 30 may be arranged in a first direction D1. One separation insulating layer 30 penetrated by the channel holes CH may be separated into a plurality of separation insulating layers 30. An upper surface of the peripheral insulating layer 110 may be exposed by the channel hole CH. A sidewall of the gate stacked structure 20 may be exposed by the channel hole CH. Sidewalls of the gate patterns 22 and the insulating patterns 21 may be exposed by the channel hole CH.

Figure 6A:
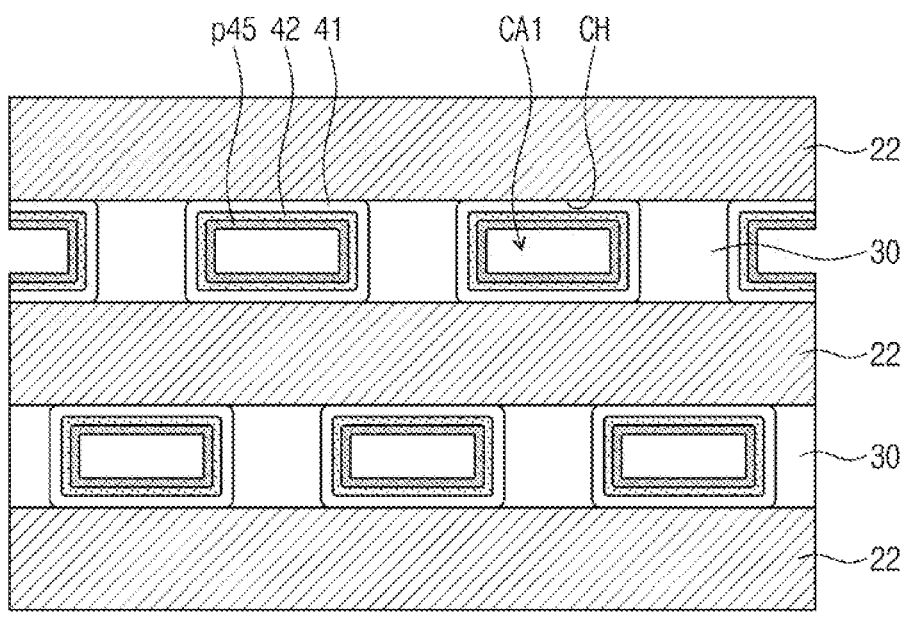
Figure 6A:
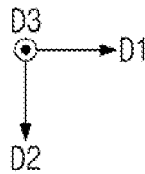
Figure 6B:
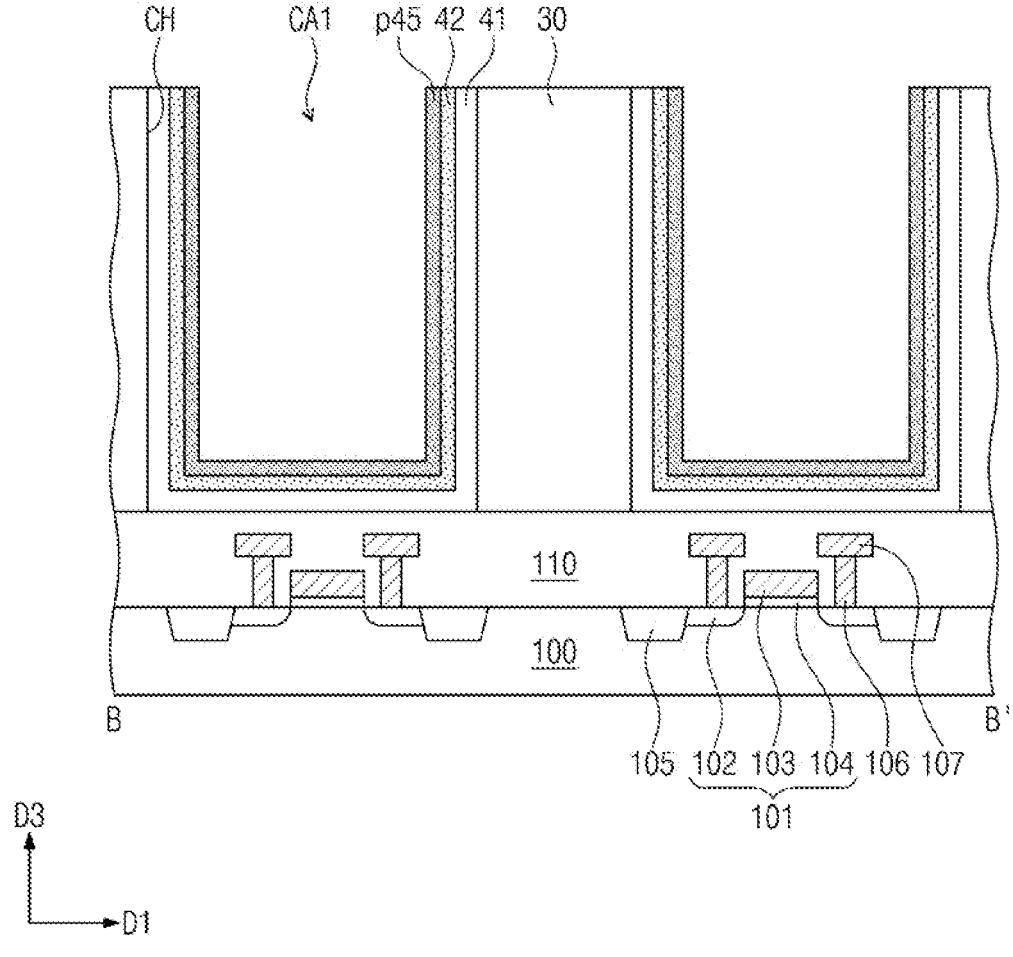
Figure 6C:
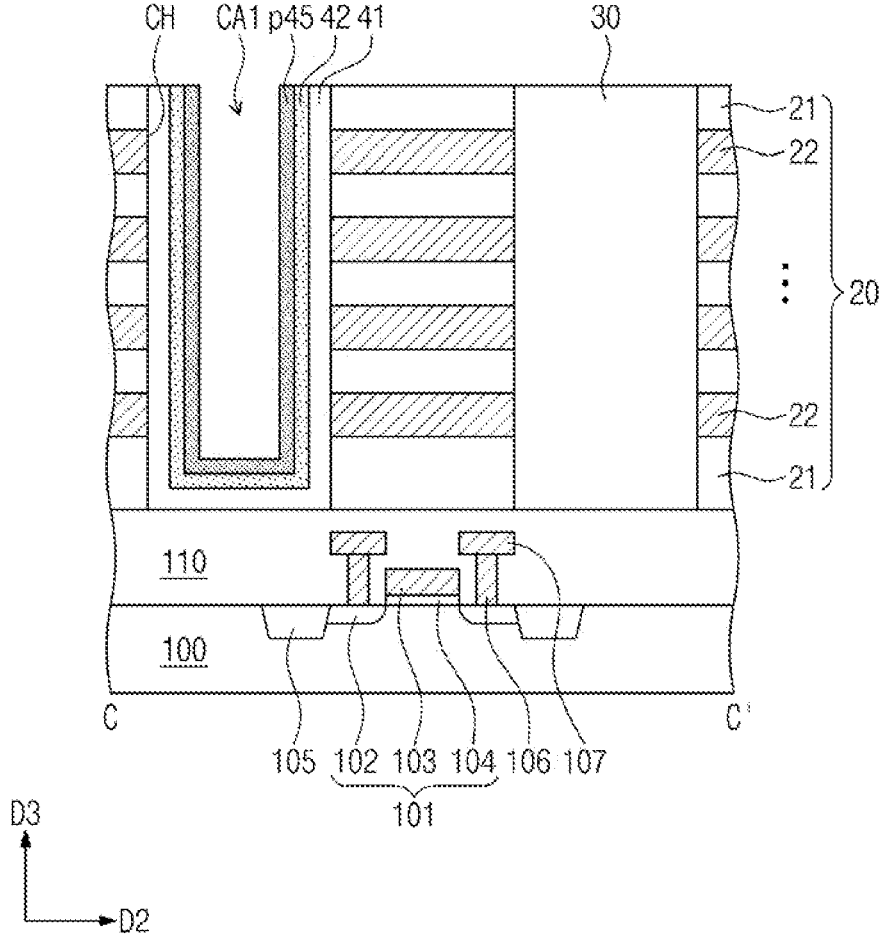

Referring to FIGS. 6A, 6B and 6C, gate insulating layers 41, channel layers 42, and preliminary variable resistive layers p45 may be formed. The gate insulating layers 41, the channel layers 42, and the preliminary variable resistive layers p45 may be conformally formed. The gate insulating layer 41, the channel layer 42, and the preliminary variable resistive layer p45 may be sequentially formed in the channel hole CH. The gate insulating layer 41 may be formed on the peripheral insulating layer 110, the channel layer 42 may be formed on the gate insulating layer 41, and the preliminary variable resistive layer p45 may be formed on the channel layer 42. The preliminary variable resistive layer p45 may include, e.g., a metal (e.g., transition metal) oxide, a perovskite oxide, or a chalcogenide oxide.

A first cavity CA1 may be defined in the channel hole CH by formation of the gate insulating layer 41, the channel layer 42, and the preliminary variable resistive layer p45. The first cavity CA1 may be an empty space surrounded by the preliminary variable resistive layer p45.

Figure 7A:
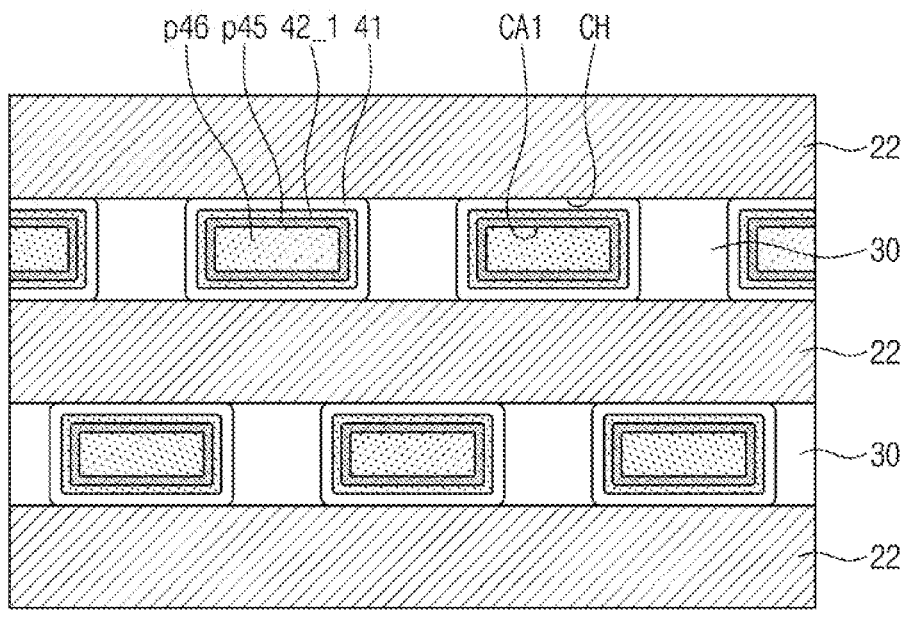
Figure 7A:
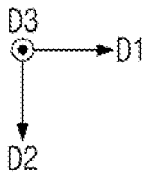
Figure 7B:
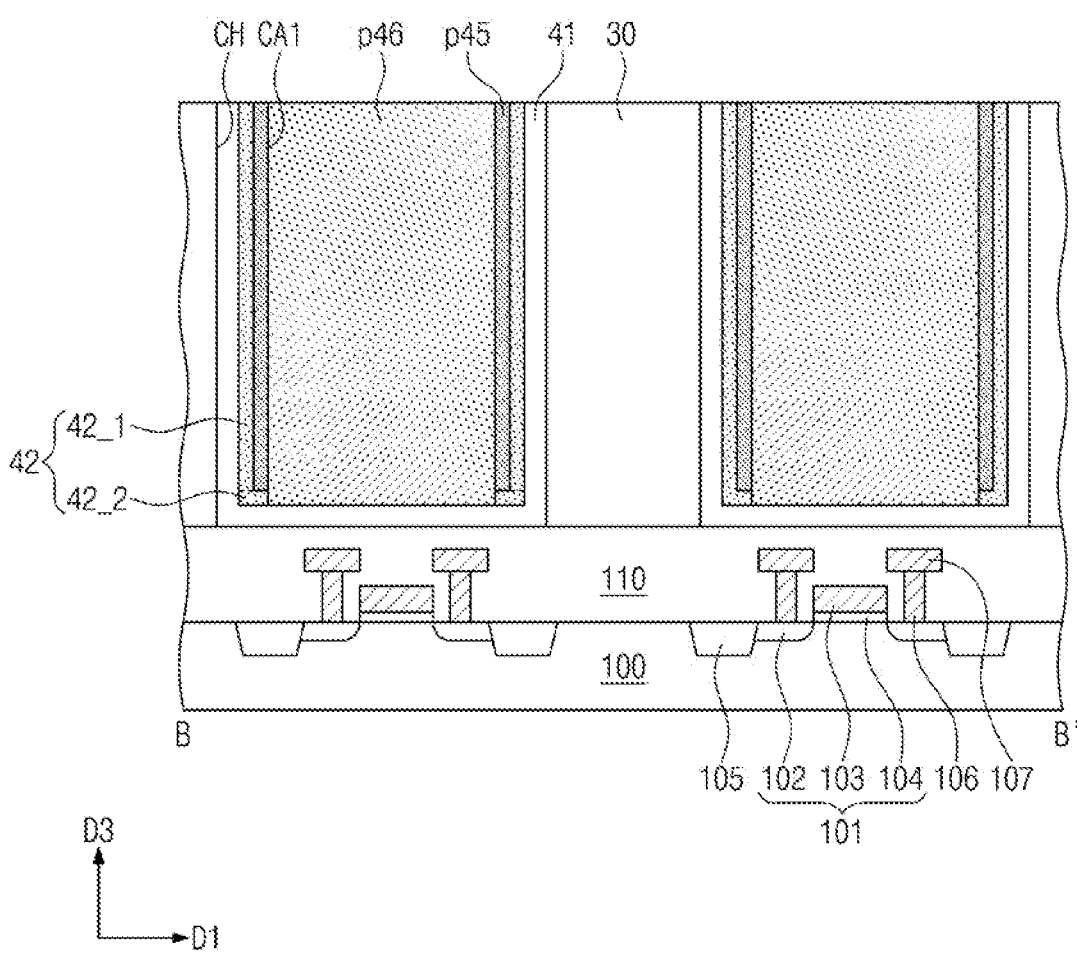
Figure 7C:
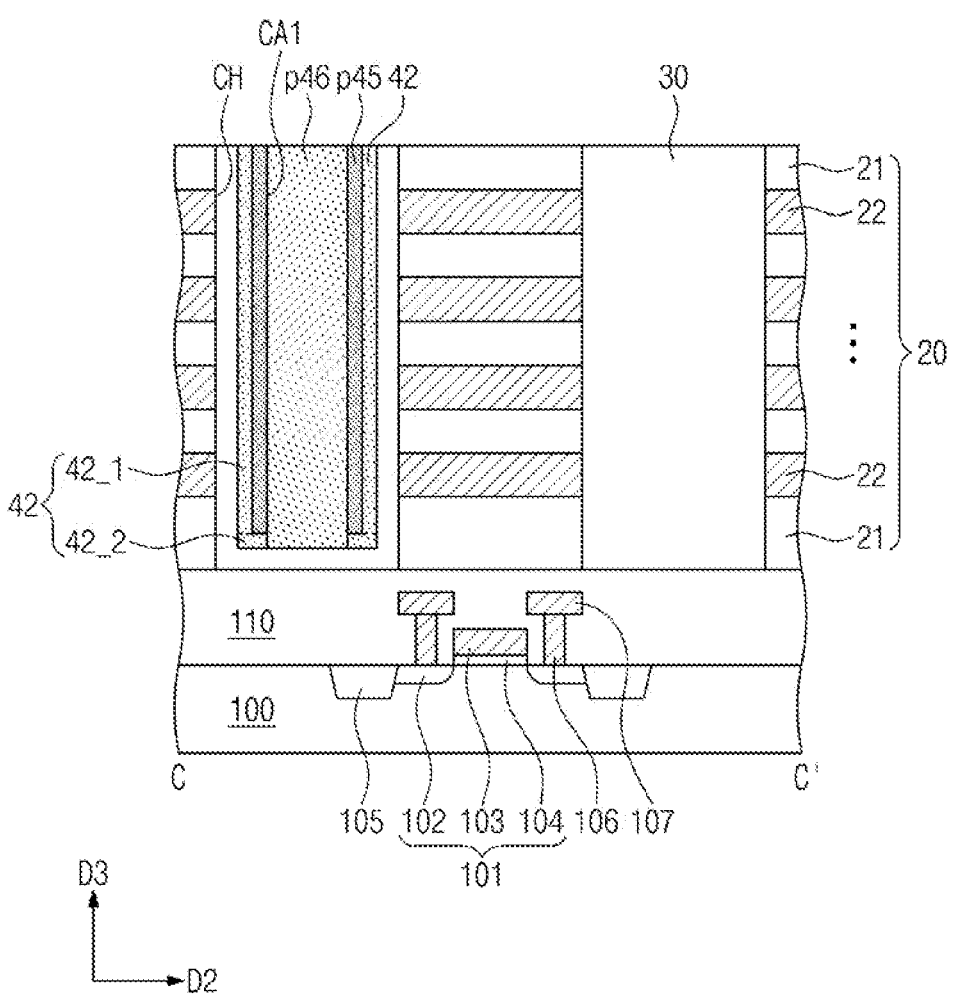
Figure 8A:
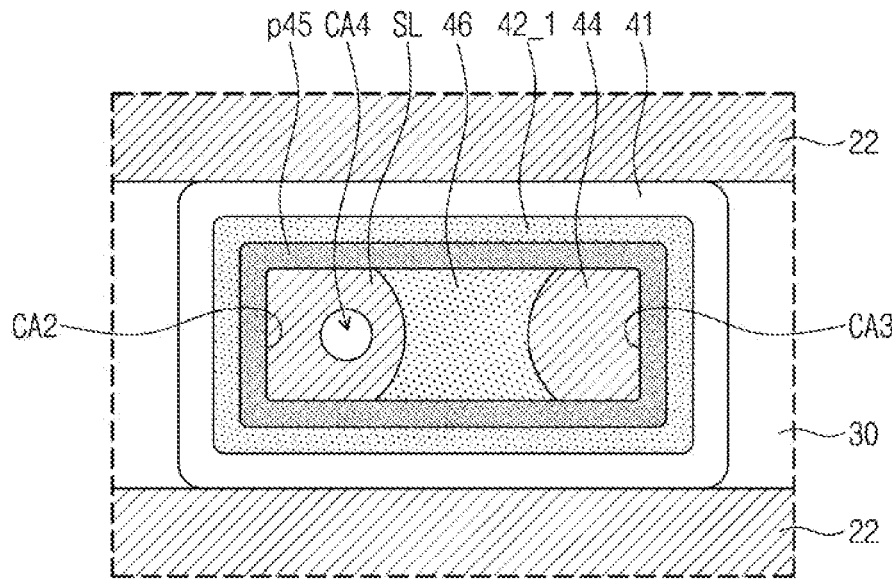
Figure 8A:
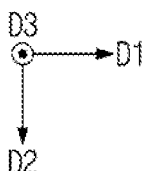

Referring to FIGS. 7A, 7B and 7C, the preliminary variable resistive layer p45 and the channel layer 42 may be etched through the first cavity CA1. In an implementation, the preliminary variable resistive layer p45 and the channel layer 42 may be etched by performing an etch-back process through the first cavity CA1. A portion of the preliminary variable resistive layer p45 overlapping the first cavity CA1 in the third direction D3 may be removed through etching. A portion of the channel layer 42 overlapping the first cavity CA1 in the third direction D3 may be removed through etching. The channel layer 42 may be etched to define an upper portion 42_1 and a lower portion 42_2 of the channel layer 42. The preliminary variable resistive layer p45 may be on the lower portion 42_2 of the channel layer 42.

Due to the etching process, the first cavity CA1 may be expanded and a surface of the gate insulating layer 41 may be exposed by the first cavity CA1. A preliminary capping layer p46 may be formed in the expanded first cavity CA1. The preliminary capping layer p46 may be formed on the gate insulating layer 41. The preliminary capping layer p46 may be surrounded by the preliminary variable resistive layer p45. The preliminary capping layer p46 may include an insulating material. In an implementation, the preliminary capping layer p46 may include silicon nitride. The preliminary capping layer p46 may be in contact with the preliminary variable resistive layer p45 and the lower portion 42_2 of the channel layer 42.

Figure 8B:
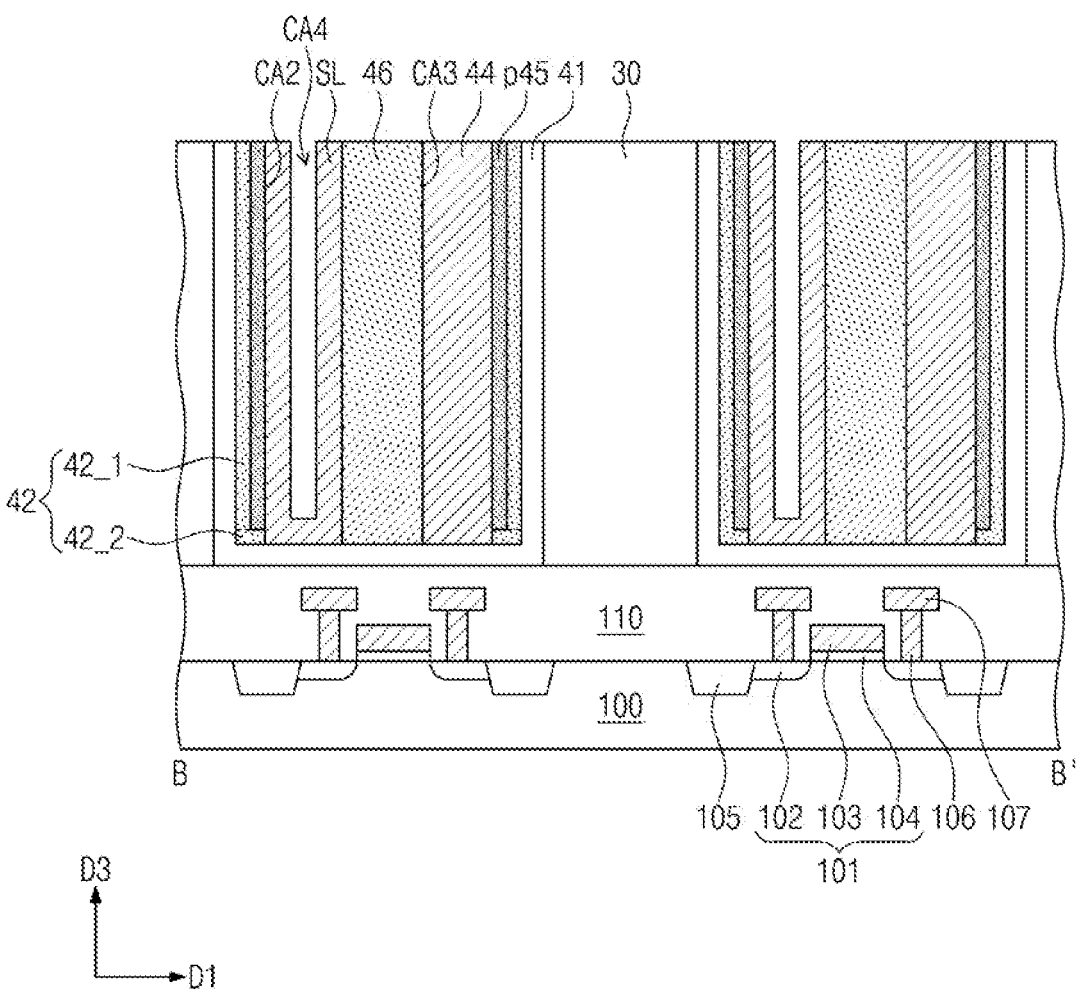
Figure 9A:
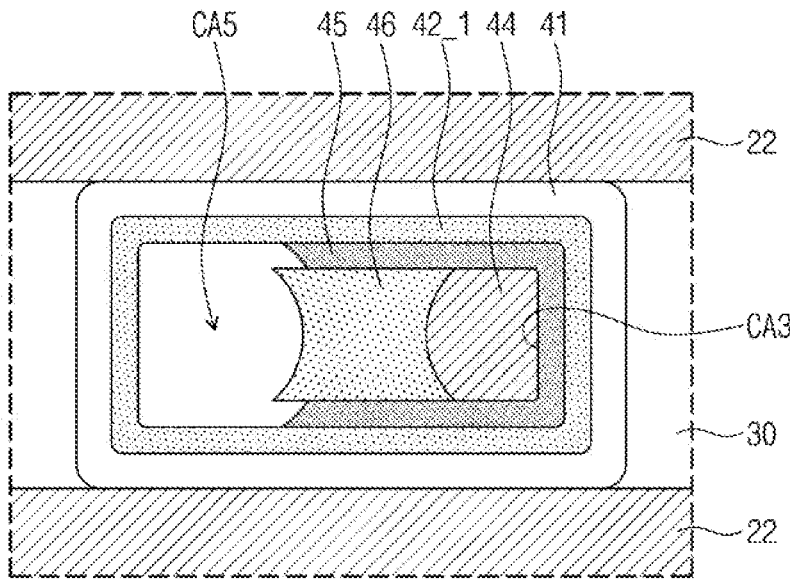
Figure 9A:
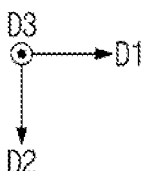

Referring to FIGS. 8A and 8B, a second cavity CA2 and a third cavity CA3 may be formed. The second cavity CA2 and the third cavity CA3 may be formed by etching the preliminary capping layer p46. The preliminary capping layer p46 may be etched to remove the first and second side portions of the preliminary capping layer p46. The second cavity CA2 may be an empty space formed by removing the first side of the preliminary capping layer p46. The third cavity CA3 may be an empty space formed by removing the second side of the preliminary capping layer p46. The first side and the second side of the preliminary capping layer p46 may be opposite to each other.

A width of the second cavity CA2 may be greater than a width of the third cavity CA3. A width of the second cavity CA2 in the first direction D1 may be greater than a width of the third cavity CA3 in the first direction D1.

The etched preliminary capping layer p46 may be defined as a capping layer 46. The capping layer 46 may be between the second cavity CA2 and the third cavity CA3. The second cavity CA2 and the third cavity CA3 may be surrounded by the preliminary variable resistive layer p45 and the capping layer 46. A sidewall of the capping layer 46, an inner sidewall of the preliminary variable resistive layer p45, an inner sidewall of the lower portion 42_2 of the channel layer 42, and a surface of the gate insulating layer 41 may be exposed by the second cavity CA2. The sidewall of the capping layer 46, the inner sidewall of the preliminary variable resistive layer p45, the inner sidewall of the lower portion 42_2 of the channel layer 42, and the surface of the gate insulating layer 41 may be exposed by the third cavity CA3.

A sacrificial line SL may be formed in the second cavity CA2. The sacrificial line SL may be conformally formed. The sacrificial line SL may be formed on the gate insulating layer 41. The sacrificial line SL may be surrounded by the preliminary variable resistive layer p45 and the capping layer 46. The sacrificial line SL may include a conductive material. In an implementation, the sacrificial line SL may include tungsten. The sacrificial line SL may be in contact with the preliminary variable resistive layer p45, the lower portion 42_2 of the channel layer 42, and the capping layer 46.

By forming the sacrificial line SL, a fourth cavity CA4 may be defined within the second cavity CA2. The fourth cavity CA4 may be an empty space surrounded by the sacrificial line SL.

A drain line 44 may be formed in the third cavity CA3. The drain line 44 may be formed on the gate insulating layer 41. The drain line 44 may be surrounded by the preliminary variable resistive layer p45 and the capping layer 46. The drain line 44 may be in contact with the preliminary variable resistive layer p45, the lower portion 42_2 of the channel layer 42, and the capping layer 46.

The sacrificial line SL and the drain line 44 may be formed simultaneously. In an implementation, the width of the second cavity CA2 may be greater than that of the third cavity CA3, the fourth cavity CA4 may be formed in the sacrificial line SL, and the drain line 44 may completely fill the third cavity CA3.

Figure 9B:
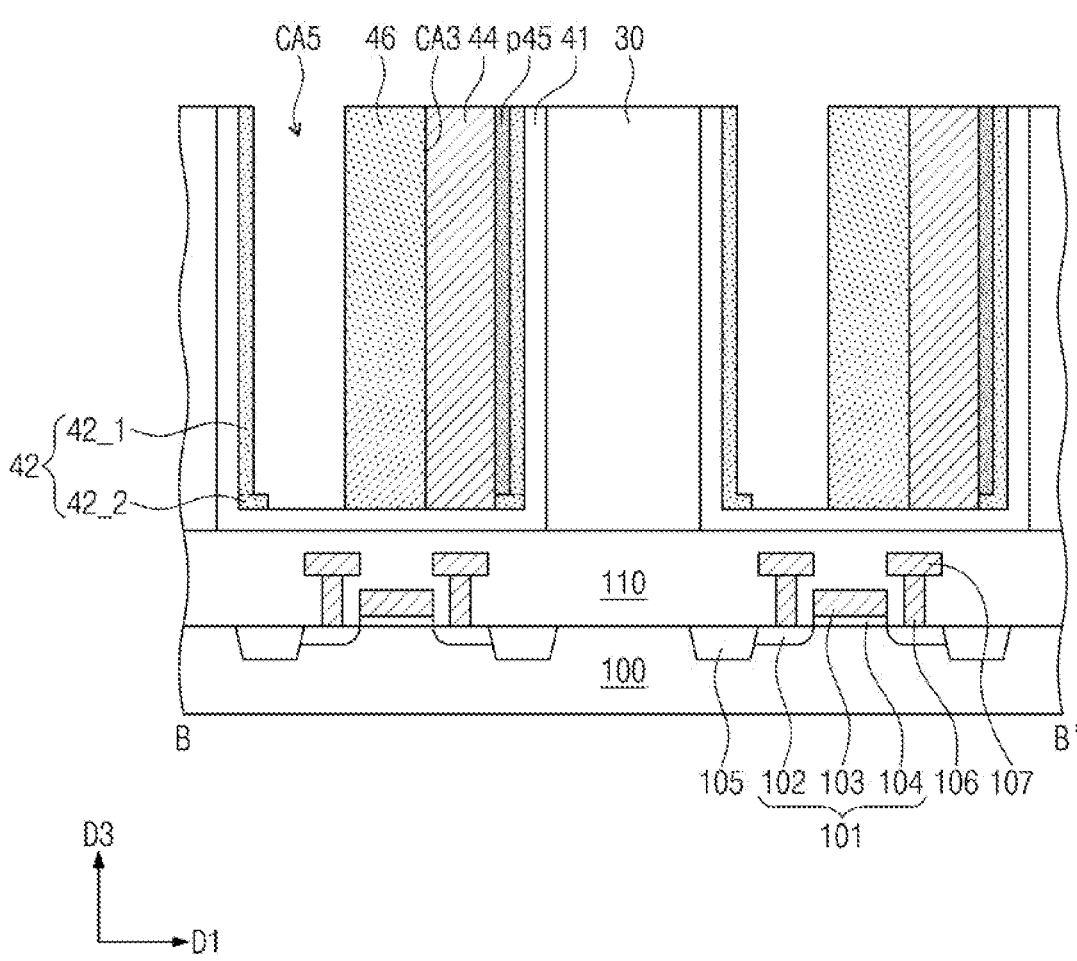

Referring to FIGS. 9A and 9B, the sacrificial line SL may be removed. In an implementation, removing the sacrificial line SL may include performing a wet etching process using an etchant capable of etching the sacrificial line SL and the drain line 44. In this case, as the sacrificial line SL is exposed by the fourth cavity CA4, the sacrificial line SL may be removed and the drain line 44 may not be removed. In an implementation, removing the sacrificial line SL may include forming a mask pattern exposing the sacrificial line SL and covering the drain line 44, and removing the sacrificial line SL using the mask pattern as an etch mask.

The sacrificial line SL may be removed, the fourth cavity CA4 may be expanded, and an inner sidewall of the preliminary variable resistive layer p45 may be exposed. A portion of the preliminary variable resistive layer p45 may be removed. The portion of the preliminary variable resistive layer p45 may be removed by etching the preliminary variable resistive layer p45 exposed through the expanded fourth cavity CA4. The preliminary variable resistive layer p45 from which the portion is removed may be defined as the variable resistive layer 45. The portion of the preliminary variable resistive layer p45 may be removed to form an empty space between the capping layer 46 and the channel layer 42. A protrusion PR (refer to FIG. 2C) of the source line 43 (refer to FIG. 2C) may be formed in an empty space between the capping layer 46 and the channel layer 42.

The portion of the preliminary variable resistive layer p45 may be removed to form a fifth cavity CA5. The fourth cavity CA4 expanded by removing the portion of the preliminary variable resistive layer p45 may be defined as the fifth cavity CA5. The fifth cavity CA5 may be formed by an inner sidewall of the upper portion 42_1 of the channel layer 42, an inner sidewall and upper surface of the lower portion 42_2 of the channel layer 42, a sidewall of the capping layer 46, a surface of the gate insulating layer 41, and a surface of the variable resistive layer 45 may be exposed. The fifth cavity CA5 may be an empty space surrounded by the channel layer 42, the variable resistive layer 45, and the capping layer 46.

A width of the fifth cavity CA5 may be greater than that of the third cavity CA3. A width of the fifth cavity CA5 in the first direction D1 may be greater than a width of the third cavity CA3 in the first direction D1. A width of the fifth cavity CA5 in the second direction D2 may be greater than a width of the third cavity CA3 in the second direction D2.

Referring to FIGS. 2A, 2B, 2C, 2D and 2E, a source line 43 may be formed in the fifth cavity CA5.

A cover insulating layer 50 may be formed. Connection contacts 61 and connection conductive lines 62 may be formed in the cover insulating layer 50.

A method of manufacturing a semiconductor device according to some embodiments may include forming the fifth cavity CA5 by removing the portions of the sacrificial line SL and the preliminary variable resistive layer p45, and the variable resistive layer 45 may be between the drain line 44 and the channel layer 42.

By way of summation and review, as high integration of the semiconductor devices intensifies, electrical character-istics and product yield of the semiconductor devices could decrease. Accordingly, improving the electrical characteristics and production yield of the semiconductor devices may be considered.

In the semiconductor device according to embodiments, both the source line and the drain line may be in the one channel hole, thereby improving the integration of the semiconductor device.

One or more embodiments may provide a semiconductor device including a variable resistive layer.

One or more embodiments may provide a semiconductor device with improved electrical characteristics and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a gate stacked structure including gate patterns and insulating patterns that are alternately stacked with each other;
a gate insulating layer on a sidewall of the gate stacked structure;
a channel layer surrounded by the gate insulating layer;
a source line surrounded by the channel layer;
a variable resistive layer surrounded by the channel layer;
a drain line surrounded by the channel layer; and
a capping layer between the source line and the drain line;
wherein the variable resistive layer includes an inner sidewall in contact with the drain line and the capping layer and an outer sidewall in contact with the channel layer.

2. The semiconductor device as claimed in claim 1, wherein the variable resistive layer, the source line, and the drain line are in the channel layer.

3. The semiconductor device as claimed in claim 1, wherein a width of the source line is greater than a width of the drain line.

4. The semiconductor device as claimed in claim 1, wherein:
the gate patterns extend in a first direction, and
a width of the source line in the first direction is greater than a width of the drain line in the first direction.

5. The semiconductor device as claimed in claim 4, wherein a width of the source line in a second direction crossing the first direction is greater than a width of the drain line in the second direction.

6. The semiconductor device as claimed in claim 1, wherein:
the channel layer includes an upper portion and a lower portion,
the source line is in contact with the upper portion of the channel layer, and
the drain line is spaced apart from the upper portion of the channel layer.

7. The semiconductor device as claimed in claim 6, wherein the variable resistive layer is between the upper portion of the channel layer and the drain line.

8. The semiconductor device as claimed in claim 1, wherein the source line is in contact with the variable resistive layer.

9. The semiconductor device as claimed in claim 1, further comprising separation insulating layers on sidewalls of the gate stacked structure,
wherein the gate insulating layer is between the separation insulating layers.

10. The semiconductor device as claimed in claim 1, wherein the variable resistive layer does not completely surround the drain line.

11. A semiconductor device, comprising:
gate stacked structures spaced apart from each other, each of the gate stacked structures including gate patterns and insulating patterns that are alternately stacked with each other;
a gate insulating layer between the gate stacked structures;
a channel layer in the gate insulating layer;
a source line in the channel layer;
a variable resistive layer in the channel layer; and
a drain line in the channel layer,
wherein the drain line and an upper portion of the channel layer are spaced apart from each other;

wherein the source line is in contact with the variable resistive layer; and wherein the source line includes a protrusion in contact with the variable resistive layer.

12. The semiconductor device as claimed in claim 11, wherein the variable resistive layer is between the drain line and the upper portion of the channel layer.

13. The semiconductor device as claimed in claim 11, further comprising a capping layer between the source line and the drain line, wherein the protrusion of the source line is between the channel layer and the capping layer.

14. The semiconductor device as claimed in claim 13, wherein the protrusion of the source line includes a first surface in contact with the capping layer and a second surface in contact with the variable resistive layer, and wherein the first surface of the protrusion of the source line is flat.

15. The semiconductor device as claimed in claim 14, wherein the second surface of the protrusion of the source line is curved.

16. The semiconductor device as claimed in claim 11, wherein a width of the protrusion of the source line is equal to a width of the variable resistive layer.

17. The semiconductor device as claimed in claim 11, wherein the variable resistive layer includes an inner side-wall in contact with the drain line and an outer sidewall in contact with the channel layer.

18. A semiconductor device, comprising:

gate stacked structures spaced apart from each other, each of the gate stacked structures including gate patterns and insulating patterns that are alternately stacked with each other;

separation insulating layers between the gate stacked structures;

a gate insulating layer between the separation insulating layers;

a channel layer surrounded by the gate insulating layer;

a source line surrounded by the channel layer;

a variable resistive layer surrounded by the channel layer;

a drain line surrounded by the channel layer; and a capping layer between the source line and the drain line, wherein the variable resistive layer includes an inner sidewall in contact with the drain line and the capping layer and an outer sidewall in contact with the channel layer.

19. The semiconductor device as claimed in claim 18, wherein the source line includes a protrusion in contact with the variable resistive layer and the capping layer.

* * * * *